(12) United States Patent
Koshi

(10) Patent No.: US 12,200,871 B2
(45) Date of Patent: Jan. 14, 2025

(54) COMPONENT-CONTAINING SUBSTRATE

(71) Applicant: SHINKO ELECTRIC INDUSTRIES CO., LTD., Nagano (JP)

(72) Inventor: Takao Koshi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 181 days.

(21) Appl. No.: 18/180,383

(22) Filed: Mar. 8, 2023

(65) Prior Publication Data

US 2023/0300990 A1 Sep. 21, 2023

(30) Foreign Application Priority Data

Mar. 17, 2022 (JP) .................................. 2022-043178

(51) Int. Cl.
*H05K 3/12* (2006.01)
*H05K 1/11* (2006.01)
*H05K 3/24* (2006.01)
*H05K 3/46* (2006.01)

(52) U.S. Cl.
CPC ............... *H05K 3/24* (2013.01); *H05K 1/115* (2013.01); *H05K 3/1258* (2013.01); *H05K 3/4626* (2013.01); *H05K 3/4652* (2013.01); *H05K 3/4697* (2013.01)

(58) Field of Classification Search
CPC ...... H05K 3/24; H05K 3/1258; H05K 3/4697; H05K 2201/09745
See application file for complete search history.

(56) References Cited

U.S. PATENT DOCUMENTS

2022/0330432 A1* 10/2022 Taniguchi .............. H05K 1/183

FOREIGN PATENT DOCUMENTS

JP 2021-141287 9/2021

* cited by examiner

*Primary Examiner* — Sherman Ng
(74) *Attorney, Agent, or Firm* — IPUSA, PLLC

(57) ABSTRACT

A component-containing substrate includes a substrate base. The substrate base includes one or more wiring layers and one or more insulating layers and includes a cavity. The component-containing substrate further includes a pad at the bottom of the cavity and an electronic component bonded to a surface of the pad exposed in the cavity. A trench is formed in the surface of the pad, the trench continuing from the inside to the outside of the perimeter of the electronic component in a plan view.

12 Claims, 15 Drawing Sheets

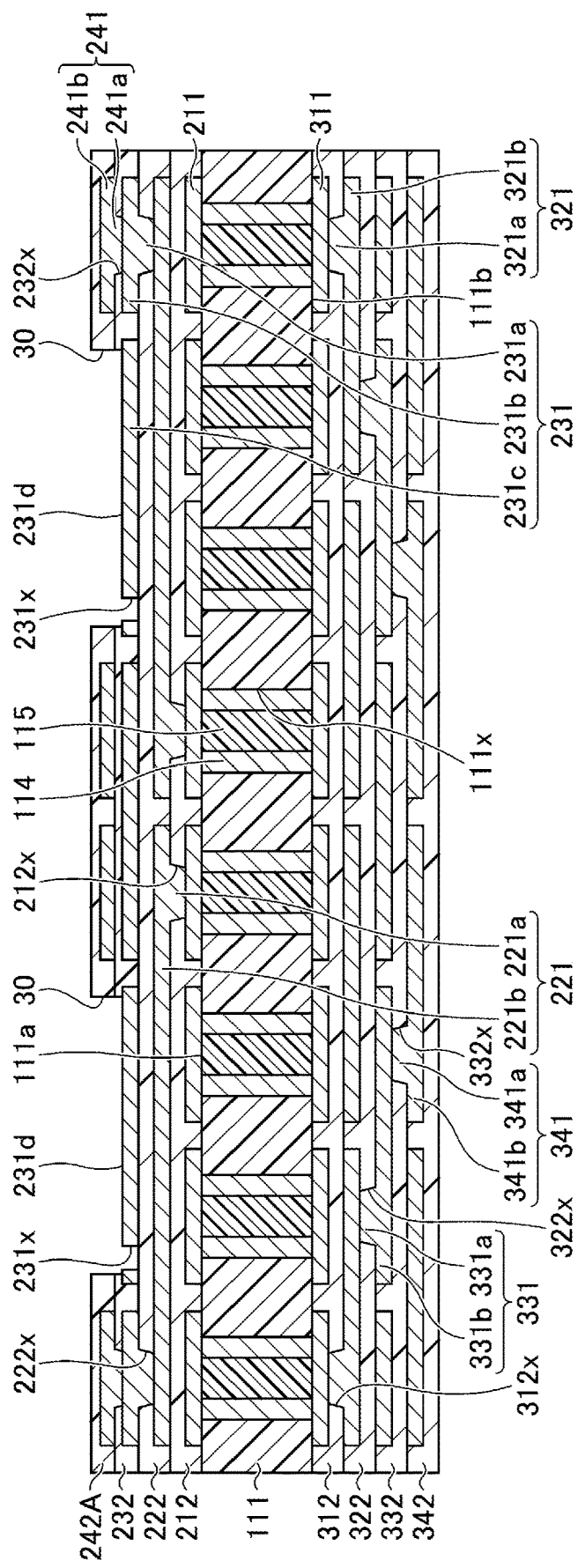

COMPONENT-CONTAINING SUBSTRATE

CROSS-REFERENCE TO RELATED APPLICATION

This application is based upon and claims priority to Japanese Patent Application No. 2022-043178, filed on Mar. 17, 2022, the entire contents of which are incorporated herein by reference.

FIELD

A certain aspect of the embodiments discussed herein is related to a substrate that contains one or more components (hereinafter "circuit-containing substrate").

BACKGROUND

For example, Japanese Laid-open Patent Publication No. 2021-141287 illustrates a component-containing substrate that contains an electronic component.

SUMMARY

According to an aspect, a component-containing substrate includes a substrate base. The substrate base includes one or more wiring layers and one or more insulating layers and includes a cavity. The component-containing substrate further includes a pad at the bottom of the cavity and an electronic component bonded to a surface of the pad exposed in the cavity. A trench is formed in the surface of the pad, the trench continuing from the inside to the outside of the perimeter of the electronic component in a plan view.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 3A through 3G are diagrams illustrating a method of manufacturing a component-containing substrate according to the first embodiment;

DESCRIPTION OF EMBODIMENTS

Figure 1:
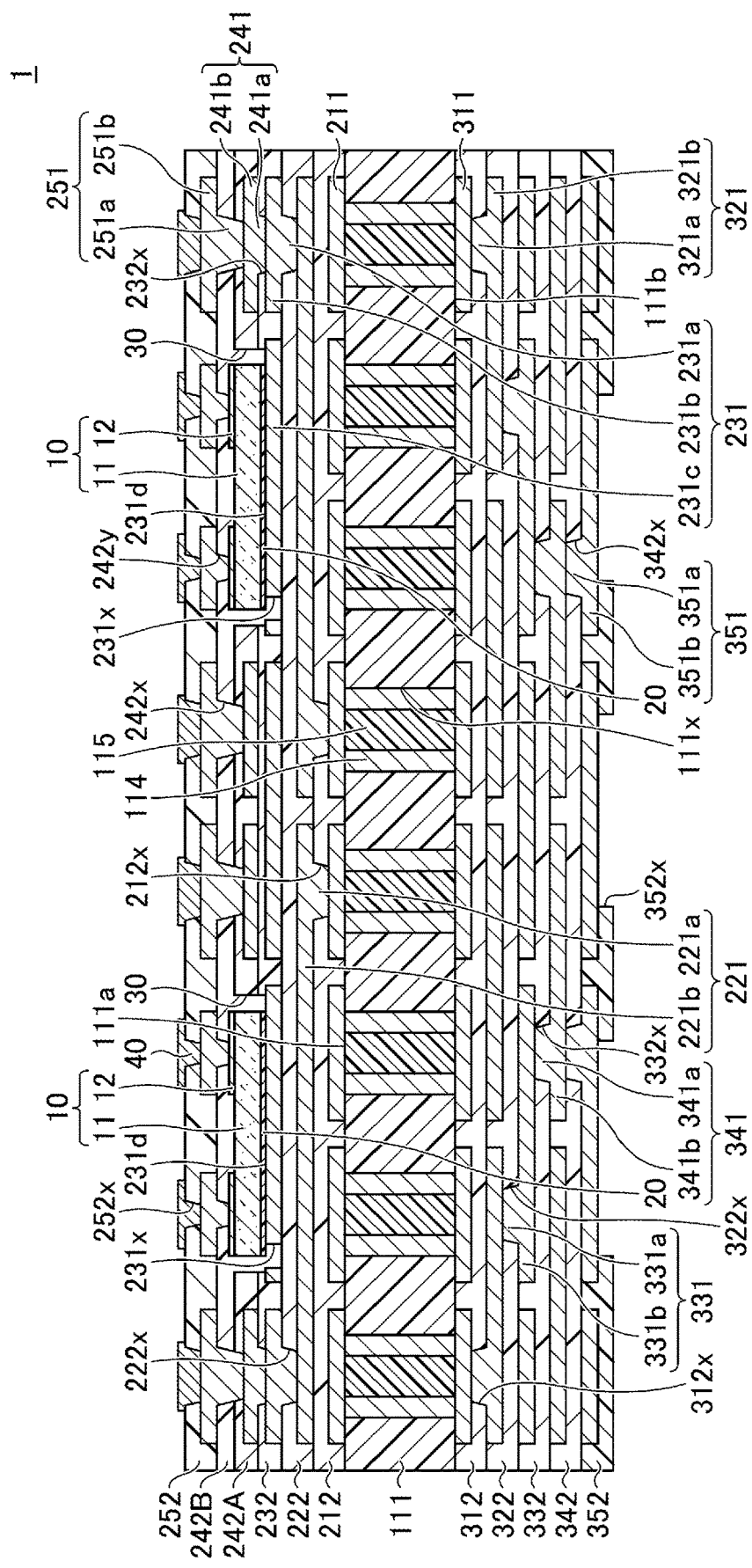
FIG. 1 is a sectional view of a component-containing substrate according to a first embodiment.

According to related-art component-containing substrates, the flatness of a surface on which a semiconductor chip is to be mounted may be so reduced as to make it difficult to mount the semiconductor chip on the surface.

According to as aspect of the present disclosure, a component-containing substrate in which a surface on which a semiconductor chip is to be mounted stably has good flatness is provided.

According to an embodiment of the present disclosure, a surface on which a semiconductor chip is to be mounted can stably has good flatness.

Embodiments of the present disclosure are explained with reference to the accompanying drawings. In the specification and drawings, constituent elements having substantially the same functional configuration are referred to using the same reference numeral and a duplicate description thereof may be omitted.

[a] First Embodiment

A first embodiment is described. The first embodiment relates to a component-containing substrate.

Figure 2:
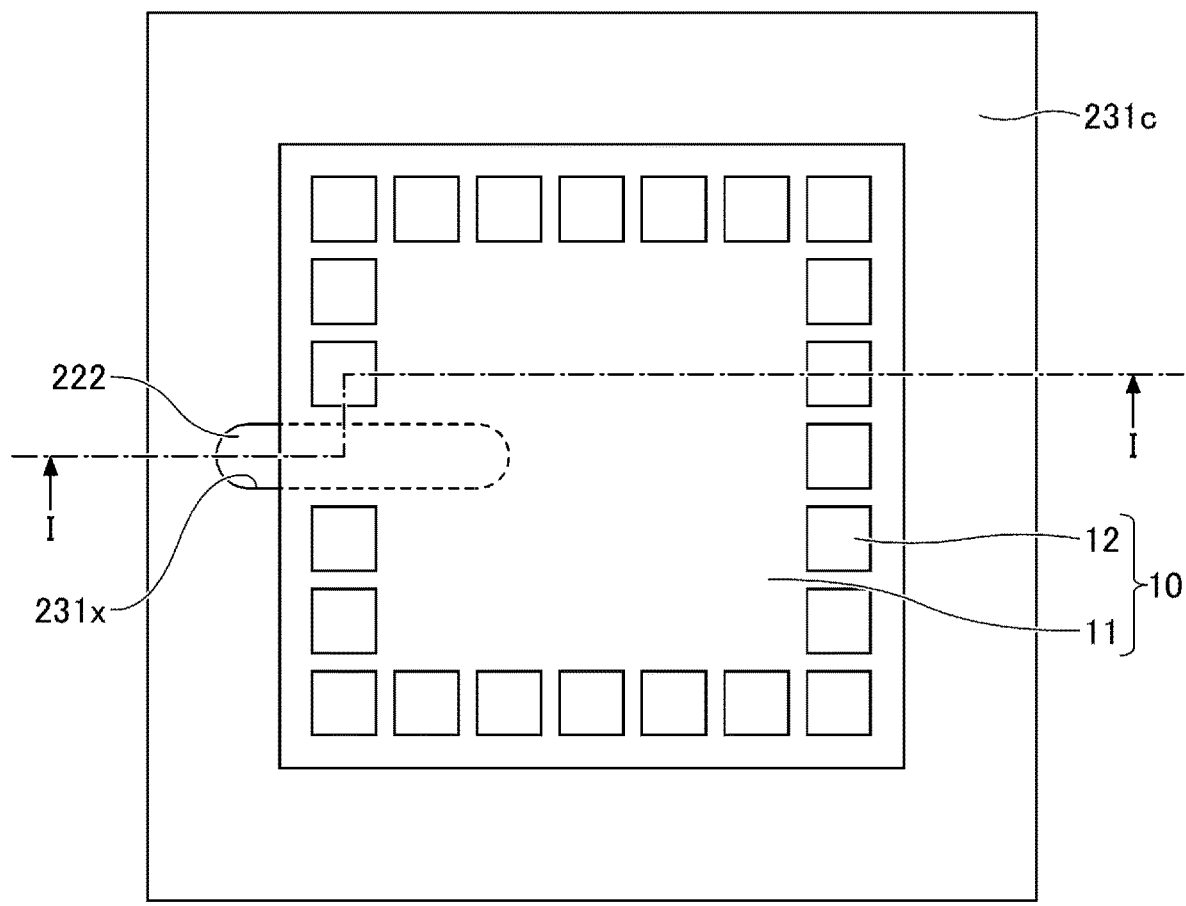
FIG. 2 is a top plan view of part of the component-containing substrate, illustrating an electronic component mounting pad and an electronic component.

First, the structure of a component-containing substrate according to the first embodiment is described. FIG. 1 is a sectional view of a component-containing substrate 1 according to the first embodiment. FIG. 2 is a top plan view of part of the component-containing substrate 1, illustrating one of pads for mounting an electronic component (hereinafter "electronic component mounting pads") 231c and a corresponding one of electronic components 10. The section of each pair of the electronic component mounting pad 231c and the electronic component 10 and its vicinity in FIG. 1 is taken along the line I-I of FIG. 2. Furthermore, in FIG. 2, the graphical representation of an insulating layer 242B, a wiring layer 251, a solder resist layer 252, and external connection terminals 40, which are on and above the electronic component 10, is omitted.

Referring to FIG. 1, the component-containing substrate 1 according to the first embodiment is a wiring substrate that includes a core layer 111 and a laminate of wiring layers and insulating layers on each side of the core layer 111. Furthermore, the component-containing substrate 1 contains the electronic components 10 on one side of the core layer 111.

Specifically, according to the component-containing substrate 1, a wiring layer 211, an insulating layer 212, a wiring layer 221, an insulating layer 222, a wiring layer 231, an insulating layer 232, a wiring layer 241, an insulating layer 242A, the insulating layer 242B, the wiring layer 251, and the solder resist layer 252 are stacked in order on a first surface 111a of the core layer 111. Furthermore, a wiring layer 311, an insulating layer 312, a wiring layer 321, an insulating layer 322, a wiring layer 331, an insulating layer 332, a wiring layer 341, an insulating layer 342, a wiring layer 351, and a solder resist layer 352 are stacked in order on a second surface 111b of the core layer 111.

According to this embodiment, for convenience, the solder resist layer 252 side of the component-containing substrate 1 is referred to as "upper side" or "first side," and the solder resist layer 352 side of the component-containing substrate 1 is referred to as "lower side" or "second side." Furthermore, with respect to each part or element of the component-containing substrate 1, a surface on the solder resist layer 252 side is referred to as "upper surface" or "first surface," and a surface on the solder resist layer 352 side is referred to as "lower surface" or "second surface." The component-containing substrate 1 may be used in an inverted position or oriented at any angle. Furthermore, a plan view refers to a view of an object in a direction normal to the first surface 111a of the core layer 111, and a planar shape refers to the shape of an object as viewed in a direction normal to the first surface 111a of the core layer 111.

Examples of the core layer 111 include a so-called glass epoxy substrate having glass cloth impregnated with an insulating resin such as an epoxy resin and a substrate having a woven or non-woven fabric of glass fibers, carbon fibers, or aramid fibers impregnated with an epoxy resin, a polyimide resin or the like. The thickness of the core layer 111 may be, for example, approximately 60 µm to approximately 400 µm. Through holes 111x are provided in the core layer 111 to pierce through the core layer 111 in a direction of its thickness. The planar shape of each through hole 111x is, for example, circular. Through vias 114 are formed one in each through hole 111x. Each through via 114 is formed on the inner wall surface of the corresponding through hole 111x, for example. In each through hole 111x, the inside of the through via 114 may be filled with an insulating layer 115.

The wiring layer 211 is famed on the first surface 111a of the core layer 111. Furthermore, the wiring layer 311 is formed on the second surface 111b of the core layer 111. The wiring layer 211 and the wiring layer 311 are electrically connected by the through vias 114. The wiring layers 211 and 311 are patterned into respective predetermined planar shapes. For example, a metallic material such as copper (Cu) may be used as a material for the wiring layers 211 and 311 and the through vias 114. The thickness of each of the wiring layers 211 and 311 may be, for example, approximately 10 µm to approximately 30 µm. The wiring layer 211, the wiring layer 311, and the through vias 114 may be formed as one-piece structure.

The insulating layer 212 is formed on the first surface 111a of the core layer 111 to cover the wiring layer 211. Examples of materials for the insulating layer 212 include an insulating resin whose main component is an epoxy resin or polyimide resin. The thickness of the insulating layer 212 may be, for example, approximately 30 µm to approximately 40 µm. The insulating layer 212 may contain a filler such as silica ($SiO_2$). The filler content of the insulating layer 212 may be suitably determined according to a required coefficient of thermal expansion (CTE).

The wiring layer 221 is famed on the first side of the insulating layer 212. The wiring layer 221 includes via interconnects 221a and a conductive pattern 221b. The via interconnects 221a fill in via holes 212x that pierce through the insulating layer 212 to expose the upper surface of the wiring layer 211. The conductive pattern 221b is formed on the upper surface of the insulating layer 212. The conductive pattern 221b is electrically connected to the wiring layer 211 via the via interconnects 221a. The via holes 212x may be recesses having the shape of an inverted truncated cone, having an upper-side opening at the upper surface of the insulating layer 212 and a lower-side opening at the upper surface of the wiring layer 211. The upper-side opening is greater in diameter than the lower-side opening. The material of the wiring layer 221 and the thickness of the conductive pattern 221b may be equal to the material and thickness, respectively, of the wiring layer 211, for example.

The insulating layer 222 is formed on the upper surface of the insulating layer 212 to cover the wiring layer 221. The material and thickness of the insulating layer 222 may be equal to the material and thickness, respectively, of the insulating layer 212, for example. The insulating layer 222 may contain a filler such as silica ($SiO_2$). The filler content of the insulating layer 222 may be equal to the filler content of the insulating layer 212, for example.

The wiring layer 231 is famed on the first side of the insulating layer 222. The wiring layer 231 includes via interconnects 231a, a conductive pattern 231b, and the electronic component mounting pads 231c. The via interconnects 231a fill in via holes 222x that pierce through the insulating layer 222 to expose the upper surface of the wiring layer 221. The conductive pattern 231b and the electronic component mounting pads 231c are formed on the upper surface of the insulating layer 222. The conductive pattern 231b is electrically connected to the wiring layer 221 via the via interconnects 231a. The via holes 222x may be recesses having the shape of an inverted truncated cone, having an upper-side opening at the upper surface of the insulating layer 222 and a lower-side opening at the upper surface of the wiring layer 221. The upper-side opening is greater in diameter than the lower-side opening. The material of the wiring layer 231 and the thicknesses of the conductive pattern 231b and the electronic component mounting pads 231c may be equal to the material and thickness, respectively, of the wiring layer 211, for example. The upper surface of each electronic component mounting pad 231c is an electronic component mounting surface 231d on which a corresponding one of the electronic components 10 is mounted.

The insulating layer 232 is formed on the upper surface of the insulating layer 222 to cover the wiring layer 231. The material and thickness of the insulating layer 232 may be equal to the material and thickness, respectively, of the insulating layer 212, for example. The insulating layer 232 may contain a filler such as silica ($SiO_2$). The filler content of the insulating layer 232 may be equal to the filler content of the insulating layer 212, for example.

The wiring layer 241 is famed on the first side of the insulating layer 232. The wiring layer 241 includes via interconnects 241a and a conductive pattern 241b. The via interconnects 241a fill in via holes 232x that pierce through the insulating layer 232 to expose the upper surface of the wiring layer 231. The conductive pattern 241b is formed on the upper surface of the insulating layer 232. The conductive pattern 241b is electrically connected to the wiring layer 231 via the via interconnects 241a. The via holes 232x may be recesses having the shape of an inverted truncated cone, having an upper-side opening at the upper surface of the insulating layer 232 and a lower-side opening at the upper surface of the wiring layer 231. The upper-side opening is greater in diameter than the lower-side opening. The material of the wiring layer 241 and the thickness of the conductive pattern 241b may be equal to the material and thickness, respectively, of the wiring layer 211, for example.

The insulating layer 242A is formed on the upper surface of the insulating layer 232 to cover the wiring layer 241. The material and thickness of the insulating layer 242A may be equal to the material and thickness, respectively, of the insulating layer 212, for example. The insulating layer 242A may contain a filler such as silica ($SiO_2$). The filler content of the insulating layer 242A may be equal to the filler content of the insulating layer 212, for example.

Cavities 30 are so formed in the insulating layers 242A and 232 as to expose the upper surfaces, namely, the electronic component mounting surfaces 231d, of the electronic component mounting pads 231c. The wiring layer 241 is not formed in an area of the insulating layer 232 where the cavities 30 are formed. That is, the cavities 30 are formed in an area of the insulating layer 232 where the wiring layer 241 is not formed and in an area of the insulating layer 242A where the wiring layer 251 is not formed. The cavities 30 have a planar shape that may be either similar or not similar to the planar shape of the electronic components 10.

Each electronic component 10 is mounted on the electronic component mounting surface 231d of the electronic component mounting pad 231c exposed in a corresponding one of the cavities 30. Each electronic component 10 includes a body 11 and terminals 12 form on the upper surface of the body 11. Examples of the electronic component 10 include a semiconductor chip, a capacitor, an inductor, and a resistor. The terminals 12 are formed of, for example, copper or the like, and each have a substantially uniform thickness.

The lower surface of the body 11 is bonded to the electronic component mounting surface 231d of the electronic component mounting pad 231c exposed in the corresponding cavity 30 via a bonding (adhesive) layer 20. Each electronic component 10 may be mounted in the corresponding cavity 30 such that the upper surface of the body 11 protrudes relative to the upper surface of the insulating layer 232, for example. Examples of materials for the bonding layer 20 include insulating adhesives (such as a die attach film) whose main component is an epoxy resin or polyimide resin. The thickness of the bonding layer 20 may be, for example, approximately 5 μm.

Referring to FIG. 2, the electronic component mounting pad 231c has a rectangular planar shape. Furthermore, a trench 231x is formed in the electronic component mounting pad 231c. The trench 231x pierces through the electronic component mounting pad 231c to expose the upper surface of the insulating layer 222. When viewed in a direction perpendicular to the bottom surface of the cavity 30 (the electronic component mounting surface 231d), namely, in a plan view, the perimeter (outer edge) of the electronic component 10 is inside (within) the perimeter (outer edge) of the electronic component mounting pad 231c. The electronic component 10 is bonded to the electronic component mounting pad 231c such that the perimeter of the electronic component 10 crosses the trench 231x. In a plan view, part of the trench 231x is inside (within) the perimeter of the electronic component 10 and is covered by the electronic component 10, and the rest of the trench 231x is outside the perimeter of the electronic component 10 and is not covered by the electronic component 10. In other words, in a plan view, the electronic component 10 overlaps, namely, lies over and covers part of, the trench 231x. Thus, in a plan view, the trench 231x continues from, for example, the inside to the outside of the perimeter of the electronic component 10. That is, in a plan view, the trench 231x lies (extends) across the perimeter of the electronic component 10 in a direction from the center to the perimeter of the electronic component mounting pad 231c, for example.

The insulating layer 242B is formed on the upper surface of the insulating layer 242A to cover the electronic components 10. Part of the insulating layer 242B is in the gaps formed between the cavities 30 and the electronic components 10. Furthermore, part of the insulating layer 242B is in the trenches 231x. For example, part of the insulating layer 242B fills in the gaps famed between the sidewalls of the cavities 30 and the side surfaces of the electronic components 10 to cover the sidewalls of the cavities 30, the side surfaces of the electronic components 10, and the upper surfaces of the electronic component mounting pad 231c. The material and thickness of the insulating layer 242B may be equal to the material and thickness, respectively, of the insulating layer 212, for example. The insulating layer 242B may contain a filler such as silica ($SiO_2$). The filler content of the insulating layer 242B may be equal to the filler content of the insulating layer 212, for example. The insulating layer 242B may be formed by filling a space around each electronic component 10 with an epoxy resin or the like that easily penetrates to fill in the trench 231x. The insulating layer 242B may fill in at least part of the trench 231x.

The wiring layer 251 is famed on the first side of the insulating layer 242B. The wiring layer 251 includes via interconnects 251a and a conductive pattern 251b. The via interconnects 251a fill in via holes 242x that pierce through the insulating layers 242B and 242A to expose the upper surface of the wiring layer 241 or in via holes 242y that pierce through the insulating layer 242B to expose the upper surfaces of the terminals 12. The conductive pattern 251b is formed on the upper surface of the insulating layer 242B. Part of the conductive pattern 251b is electrically connected to the conductive pattern 241b via the via interconnects 251a piercing through the insulating layers 242B and 242A. Another part of the conductive pattern 251b is electrically connected to the terminals 12 via the via interconnects 251a piercing through the insulating layer 242B. The via holes 242x and 242y may be recesses having the shape of an inverted truncated cone, having an upper-side opening at the upper surface of the insulating layer 242B and a lower-side opening at the upper surface of the wiring layer 241 or the upper surface of the corresponding terminal 12. The upper-side opening is greater in diameter than the lower-side opening. The material of the wiring layer 251 and the thickness of the conductive pattern 251b may be equal to the material and thickness, respectively, of the wiring layer 211, for example.

The solder resist layer 252 is the first-side outermost layer of the component-containing substrate 1, and is formed on the upper surface of the insulating layer 242B to cover the wiring layer 251. The solder resist layer 252 may be formed of, for example, a photosensitive resin such as a photosensitive epoxy resin or a photosensitive acrylic resin. The thickness of the solder resist layer 252 may be, for example, approximately 15 μm to approximately 35 μm.

The solder resist layer 252 includes openings 252x. Part of the upper surface of the wiring layer 251 is exposed at the bottom of the openings 252x. The planar shape of the openings 252x may be, for example, circular. A metal layer may be formed or anti-oxidation treatment such as organic solderability preservative (OSP) may be provided on the upper surface of the wiring layer 251 exposed in the openings 252x on an as-needed basis. Examples of such metal layers include a gold (Au) layer, a Ni/Au layer (a laminated metal layer of a nickel [Ni] layer and a Au layer stacked in this order), and a Ni/Pd/Au layer (a laminated metal layer of a Ni layer, a palladium [Pd] layer, and a Au layer stacked in this order).

The external connection terminals 40 are foiled on the upper surface of the wiring layer 251 exposed at the bottom of the openings 252x. The external connection terminals 40 are, for example, solder bumps. Examples of materials for solder bumps include alloys containing lead (Pb), tin-copper (Sn—Cu) alloys, tin-silver (Sn—Ag) alloys, and tin-silver-copper (Sn—Ag—Cu) alloys. The external connection terminals 40 serve as terminals for electrically connecting to a semiconductor chip.

The insulating layer 312 is formed on the second surface 111b of the core layer 111 to cover the wiring layer 311. The material and thickness of the insulating layer 312 may be equal to the material and thickness, respectively, of the insulating layer 212, for example. The insulating layer 312 may contain a filler such as silica (SiO$_2$). The filler content of the insulating layer 312 may be equal to the filler content of the insulating layer 212, for example.

The wiring layer 321 is famed on the second side of the insulating layer 312. The wiring layer 321 includes via interconnects 321a and a conductive pattern 321b. The via interconnects 321a fill in via holes 312x that pierce through the insulating layer 312 to expose the lower surface of the wiring layer 311. The conductive pattern 321b is formed on the lower surface of the insulating layer 312. The conductive pattern 321b is electrically connected to the wiring layer 311 via the via interconnects 321a. The via holes 312x may be recesses having the shape of a truncated cone, having a lower-side opening at the lower surface of the insulating layer 312 and an upper-side opening at the lower surface of the wiring layer 311. The lower-side opening is greater in diameter than the upper-side opening. The material of the wiring layer 321 and the thickness of the conductive pattern 321b may be equal to the material and thickness, respectively, of the wiring layer 211, for example.

The insulating layer 322 is famed on the lower surface of the insulating layer 312 to cover the wiring layer 321. The material and thickness of the insulating layer 322 may be equal to the material and thickness, respectively, of the insulating layer 212, for example. The insulating layer 322 may contain a filler such as silica (SiO$_2$). The filler content of the insulating layer 322 may be equal to the filler content of the insulating layer 212, for example.

The wiring layer 331 is famed on the second side of the insulating layer 322. The wiring layer 331 includes via interconnects 331a and a conductive pattern 331b. The via interconnects 331a fill in via holes 322x that pierce through the insulating layer 322 to expose the lower surface of the wiring layer 321. The conductive pattern 331b is formed on the lower surface of the insulating layer 322. The conductive pattern 331b is electrically connected to the wiring layer 321 via the via interconnects 331a. The via holes 322x may be recesses having the shape of a truncated cone, having a lower-side opening at the lower surface of the insulating layer 322 and an upper-side opening at the lower surface of the wiring layer 321. The lower-side opening is greater in diameter than the upper-side opening. The material of the wiring layer 331 and the thickness of the conductive pattern 331b may be equal to the material and thickness, respectively, of the wiring layer 211, for example.

The insulating layer 332 is formed on the lower surface of the insulating layer 322 to cover the wiring layer 331. The material and thickness of the insulating layer 332 may be equal to the material and thickness, respectively, of the insulating layer 212, for example. The insulating layer 332 may contain a filler such as silica (SiO$_2$). The filler content of the insulating layer 332 may be equal to the filler content of the insulating layer 212, for example.

The wiring layer 341 is formed on the second side of the insulating layer 332. The wiring layer 341 includes via interconnects 341a and a conductive pattern 341b. The via interconnects 341a fill in via holes 332x that pierce through the insulating layer 332 to expose the lower surface of the wiring layer 331. The conductive pattern 341b is formed on the lower surface of the insulating layer 332. The conductive pattern 341b is electrically connected to the wiring layer 331 via the via interconnects 341a. The via holes 332x may be recesses having the shape of a truncated cone, having a lower-side opening at the lower surface of the insulating layer 332 and an upper-side opening at the lower surface of the wiring layer 331. The lower-side opening is greater in diameter than the upper-side opening. The material of the wiring layer 341 and the thickness of the conductive pattern 341b may be equal to the material and thickness, respectively, of the wiring layer 211, for example.

The insulating layer 342 is formed on the lower surface of the insulating layer 332 to cover the wiring layer 341. The material and thickness of the insulating layer 342 may be equal to the material and thickness, respectively, of the insulating layer 212, for example. The insulating layer 342 may contain a filler such as silica (SiO$_2$). The filler content of the insulating layer 342 may be equal to the filler content of the insulating layer 212, for example.

The wiring layer 351 is formed on the second side of the insulating layer 342. The wiring layer 351 includes via interconnects 351a and a conductive pattern 351b. The via interconnects 351a fill in via holes 342x that pierce through the insulating layer 342 to expose the lower surface of the wiring layer 341. The conductive pattern 351b is formed on the lower surface of the insulating layer 342. The conductive pattern 351b is electrically connected to the wiring layer 341 via the via interconnects 351a. The via holes 342x may be recesses having the shape of a truncated cone, having a lower-side opening at the lower surface of the insulating layer 342 and an upper-side opening at the lower surface of the wiring layer 341. The lower-side opening is greater in diameter than the upper-side opening. The material of the wiring layer 351 and the thickness of the conductive pattern 351b may be equal to the material and thickness, respectively, of the wiring layer 211, for example.

The solder resist layer 352 is the second-side outermost layer of the component-containing substrate 1, and is formed on the lower surface of the insulating layer 342 to cover the wiring layer 351. The material and thickness of the solder resist layer 352 may be equal to the material and thickness, respectively, of the solder resist layer 252, for example. The solder resist layer 352 includes openings 352x. Part of the lower surface of the wiring layer 351 is exposed in the openings 352x. The planar shape of the openings 352x may be, for example, circular. The wiring layer 351 exposed in the openings 352x may be used as pads for electrically connecting to a mounting board (not depicted) such as a motherboard. The above-described metal layer may be formed or anti-oxidation treatment such as OSP may be provided on the lower surface of the wiring layer 351 exposed in the openings 352x on an as-needed basis.

Next, a method of manufacturing a component-containing substrate according to the first embodiment is described. FIGS. 3A through 3G are diagrams illustrating a method of manufacturing a component-containing substrate according to the first embodiment. Here, a process of manufacturing a single component-containing substrate is illustrated by way of example. The process, however, may be adapted to manufacture a structure to become multiple component-containing substrates and thereafter divide the structure into individual component-containing substrates.

Figure 3A:
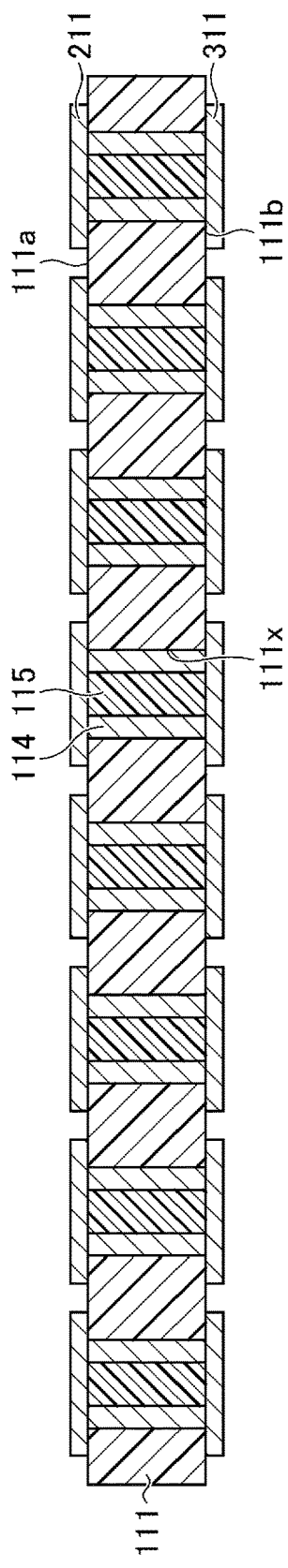

First, in the process illustrated in FIG. 3A, the through vias 114, the insulating layer 115, the wiring layer 211, and the wiring layer 311 are formed on the core layer 111. Specifically, for example, a laminate including the core layer 111, which is a so-called glass epoxy substrate or the like, and unpatterned plain copper foil formed on each of the first surface 111a and the second surface 111b of the core layer 111 is prepared. In the prepared laminate, the thickness of the copper foil on each surface is reduced on an as-needed basis, and thereafter, the through holes 111x piercing through the core layer 111 and the copper foil on each surface are formed by, for example, laser processing using a $CO_2$ laser or the like.

Next, a desmear process is performed on an as-needed basis to remove the residual resin of the core layer 111 adhering to the inner wall surfaces of the through holes 111x. Then, a seed layer (for example, copper) covering the copper foil on each surface and the inner wall surfaces of the through holes 111x is famed by, for example, electroless plating or sputtering, and an electroplating layer (for example, copper) is formed on the seed layer by electroplating using the seed layer as a power feed layer. As a result, the through vias 114 are formed. Next, in each through hole 111x, the inside of the through via 114 is filled with the insulating layer 115. Next, the wiring layer 211 is formed on the first surface 111a of the core layer 111 and the wiring layer 311 is formed on the second surface 111b of the core layer 111 by a subtractive process or the like.

Figure 3B:
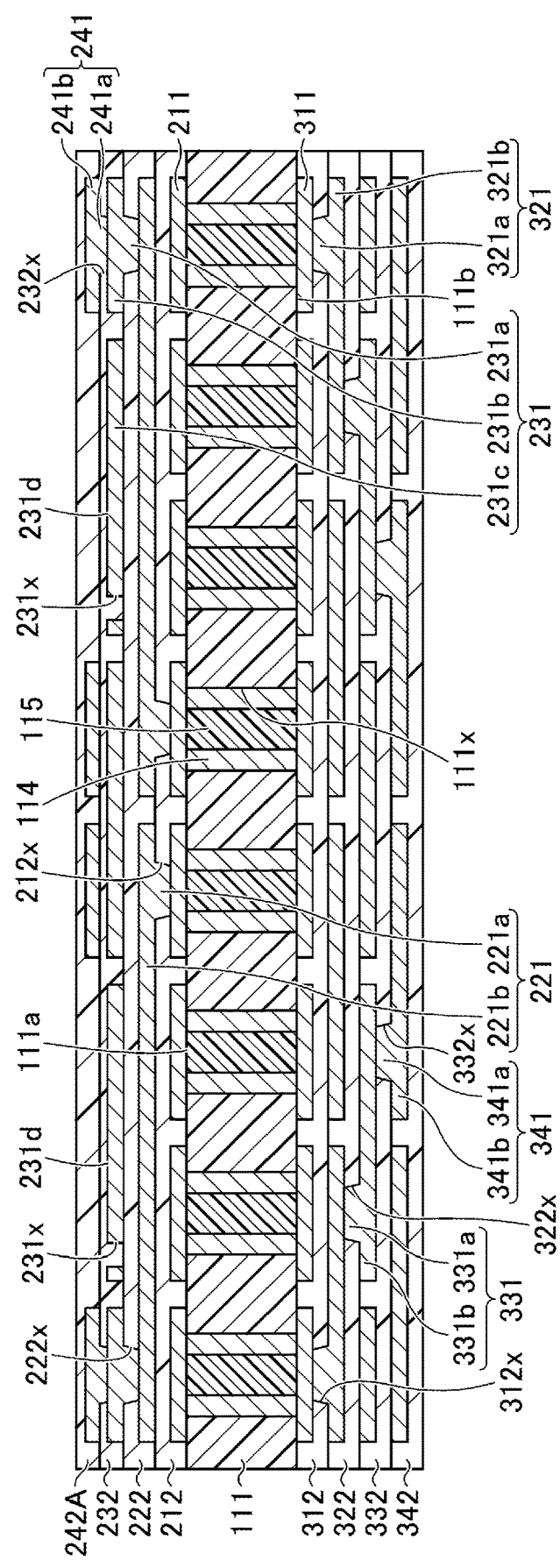

Next, in the process illustrated in FIG. 3B, the first surface 111a of the core layer 111 is laminated with a semi-cured epoxy resin film or the like such that the wiring layer 211 is covered with the semi-cured epoxy resin film, and the semi-cured epoxy resin film is cured to form the insulating layer 212. Furthermore, the second surface 111b of the core layer 111 is laminated with a semi-cured epoxy resin film or the like such that the wiring layer 311 is covered with the semi-cured epoxy resin film, and the semi-cured epoxy resin film is cured to form the insulating layer 312. Alternatively, instead of laminating the first surface 111a and the second surface 111b with an epoxy resin film or the like, epoxy resin liquid or paste or the like may be applied to the first surface 111a and the second surface 111b and thereafter cured to form the insulating layers 212 and 312. Each of the insulating layers 212 and 312 may be, for example, approximately 30 μm to approximately 40 μm in thickness. Each of the insulating layers 212 and 312 may contain a filler such as silica ($SiO_2$).

Next, the via holes 212x piercing through the insulating layer 212 to expose the upper surface of the wiring layer 211 are formed in the insulating layer 212. Furthermore, the via holes 312x piercing through the insulating layer 312 to expose the lower surface of the wiring layer 311 are formed in the insulating layer 312. The via holes 212x and 312x may be famed by, for example, laser processing using a $CO_2$ laser or the like. After formation of the via holes 212x and 312x, it is preferable to perform a desmear process to remove residual resin adhering to the surfaces of the wiring layers 211 and 311 exposed at the bottom of the via holes 212x and 312x, respectively.

Next, the wiring layer 221 is formed on the first side of the insulating layer 212. The wiring layer 221 includes the via interconnects 221a filling in the via holes 212x and the conductive pattern 221b formed on the upper surface of the insulating layer 212. The material of the wiring layer 221 and the thickness of the conductive pattern 221b may be equal to the material and thickness, respectively, of the wiring layer 211, for example. The wiring layer 221 is electrically connected to the wiring layer 211 exposed at the bottom of the via holes 212x.

Furthermore, the wiring layer 321 is formed on the second side of the insulating layer 312. The wiring layer 321 includes the via interconnects 321a filling in the via holes 312x and the conductive pattern 321b famed on the lower surface of the insulating layer 312. The material of the wiring layer 321 and the thickness of the conductive pattern 321b may be equal to the material and thickness, respectively, of the wiring layer 211, for example. The wiring layer 321 is electrically connected to the wiring layer 311 exposed at the bottom of the via holes 312x. The wiring layers 221 and 321 may be formed using a process among a variety of wiring forming processes, such as a semi-additive process or a subtractive process.

For example, in the case of forming the wiring layer 221 using a semi-additive process, the via holes 212x are formed in the insulating layer 212, and a seed layer is then famed on the surface of the insulating layer 212 including the inner wall surfaces of the via holes 212x and on the surface of the wiring layer 211 exposed in the via holes 212x by electroless plating of copper. Next, a plating resist pattern having openings matching the shape of the conductive pattern 221b of the wiring layer 221 is formed on the seed layer, and an electroplating layer is deposited on the seed layer exposed in the openings of the plating resist pattern by electroplating of copper feeding power from the seed layer. Next, the plating resist pattern is removed, and etching is then performed using the electroplating layer as a mask to remove the seed layer exposed through the electroplating layer. As a result, the wiring layer 221 including the via interconnects 221a and the conductive pattern 221b can be obtained.

Next, the insulating layer 222 is formed on the upper surface of the insulating layer 212 to cover the wiring layer 221 by the same process as the insulating layer 212. The material and thickness of the insulating layer 222 may be equal to the material and thickness, respectively, of the insulating layer 212, for example. Then, the via holes 222x are formed by the same process as the via holes 212x. Then, the wiring layer 231 is famed on the first side of the insulating layer 222 by the same process as the wiring layer 221. The wiring layer 231 includes the via interconnects 231a filling in the via holes 222x, the conductive pattern 231b formed on the upper surface of the insulating layer 222, and the electronic component mounting pads 231c famed on the upper surface of the insulating layer 222. The material of the wiring layer 231 and the thicknesses of the conductive pattern 231b and the electronic component mounting pads 231c may be equal to the material and thickness, respectively, of the wiring layer 211, for example. The wiring layer 231 is electrically connected to the wiring layer 221 exposed at the bottom of the via holes 222x. The electronic component mounting pads 231c have a rectangular planar shape. The trenches 231x are formed one in each of the electronic component mounting pads 231c (see FIG. 2).

Furthermore, the insulating layer 322 is foiled on the lower surface of the insulating layer 312 to cover the wiring layer 321 by the same process as the insulating layer 212. The material and thickness of the insulating layer 322 may be equal to the material and thickness, respectively, of the insulating layer 212, for example. Then, the via holes 322x are formed by the same process as the via holes 212x. Then, the wiring layer 331 is famed on the second side of the insulating layer 322 by the same process as the wiring layer 221. The wiring layer 331 includes the via interconnects 331a filling in the via holes 322x and the conductive pattern 331b formed on the lower surface of the insulating layer 322. The material of the wiring layer 331 and the thicknesses of the conductive pattern 331b may be equal to the material and thickness, respectively, of the wiring layer 211, for example. The wiring layer 331 is electrically connected to the wiring layer 321 exposed at the bottom of the via holes 322x.

Next, the insulating layer 232 is formed on the upper surface of the insulating layer 222 to cover the wiring layer 231 by the same process as the insulating layer 212. The material and thickness of the insulating layer 232 may be equal to the material and thickness, respectively, of the insulating layer 212, for example. Then, the via holes 232x are formed by the same process as the via holes 212x. Then, the wiring layer 241 is famed on the first side of the insulating layer 232 by the same process as the wiring layer 221. The wiring layer 241 includes the via interconnects 241a filling in the via holes 232x and the conductive pattern 241b formed on the upper surface of the insulating layer 232. The material of the wiring layer 241 and the thicknesses of the conductive pattern 241b may be equal to the material and thickness, respectively, of the wiring layer 211, for example. The wiring layer 241 is electrically connected to the wiring layer 231 exposed at the bottom of the via holes 232x.

Furthermore, the insulating layer 332 is famed on the lower surface of the insulating layer 322 to cover the wiring layer 331 by the same process as the insulating layer 212. The material and thickness of the insulating layer 332 may be equal to the material and thickness, respectively, of the insulating layer 212, for example. Then, the via holes 332x are formed by the same process as the via holes 212x. Then, the wiring layer 341 is famed on the second side of the insulating layer 332 by the same process as the wiring layer 221. The wiring layer 341 includes the via interconnects 341a filling in the via holes 332x and the conductive pattern 341b formed on the lower surface of the insulating layer 332. The material of the wiring layer 341 and the thicknesses of the conductive pattern 341b may be equal to the material and thickness, respectively, of the wiring layer 211, for example. The wiring layer 341 is electrically connected to the wiring layer 331 exposed at the bottom of the via holes 332x.

Next, the insulating layer 242A is formed on the upper surface of the insulating layer 232 to cover the wiring layer 241 by the same process as the insulating layer 212. The material and thickness of the insulating layer 242A may be equal to the material and thickness, respectively, of the insulating layer 212, for example.

Furthermore, the insulating layer 342 is famed on the lower surface of the insulating layer 332 to cover the wiring layer 341 by the same process as the insulating layer 212. The material and thickness of the insulating layer 342 may be equal to the material and thickness, respectively, of the insulating layer 212, for example.

Next, in the process illustrated in FIG. 3C, the cavities 30 that expose the upper surfaces, namely, the electronic component mounting surfaces 231d, of the electronic component mounting pads 231c are formed in the insulating layers 242A and 232. The planar shape of each cavity 30 is so determined as to have a gap of a predetermined value between the side surface of the electronic component 10 to be mounted and the sidewall of the cavity 30 so that the insulating layer 242B to be formed on the electronic component 10 in a later process has a uniform thickness. The cavities 30 may be formed by, for example, laser processing using a $CO_2$ laser or the like.

Figure 3D:
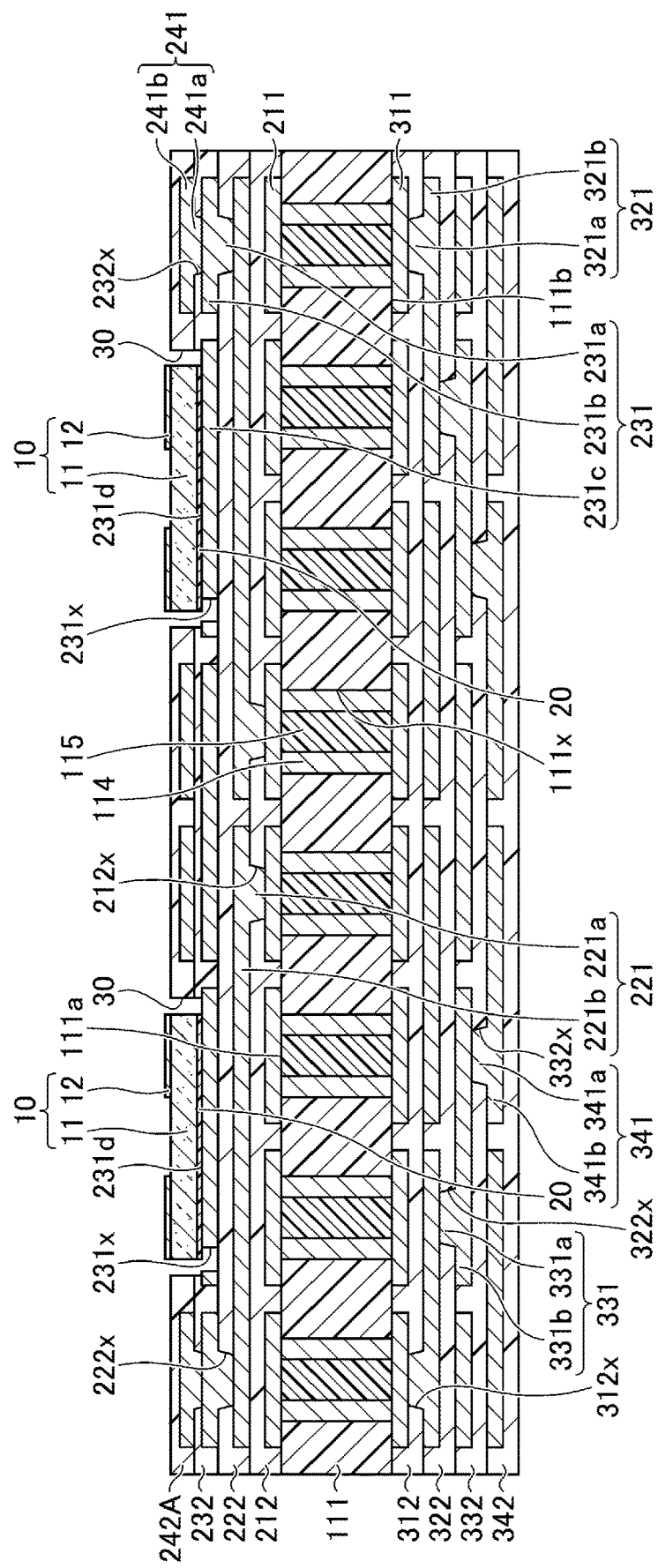

Next, in the process illustrated in FIG. 3D, the electronic components 10 each including the body 11 and the terminals 12 are prepared, and are bonded to the electronic component mounting pads 231c in the cavities 30. The bonding layer 20 is formed in advance on the lower surfaces of the electronic components 10.

Figure 4A:
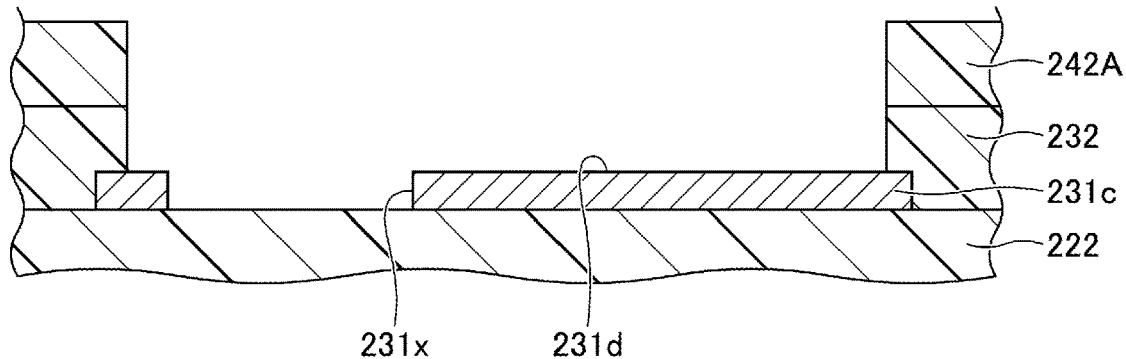
FIGS. 4A through 4C are sectional views illustrating a method of bonding the electronic component to the electronic component mounting pad according to the first embodiment.
Figure 4B:
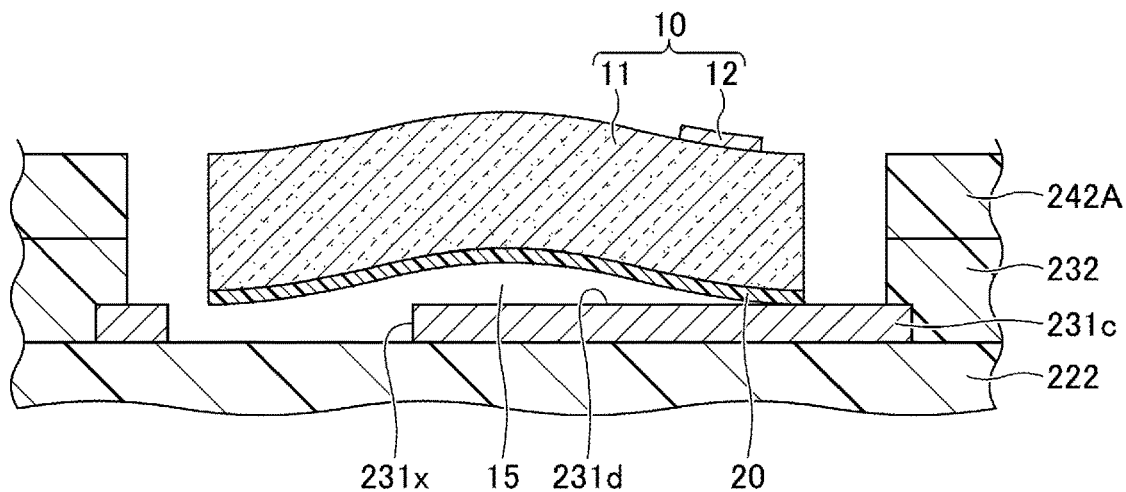
Figure 4C:
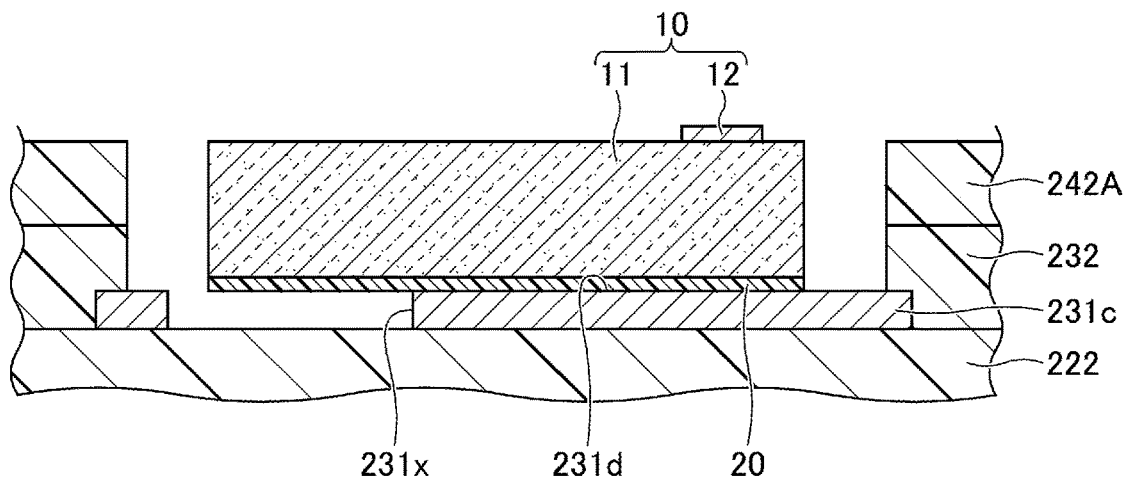
Figure 5A:
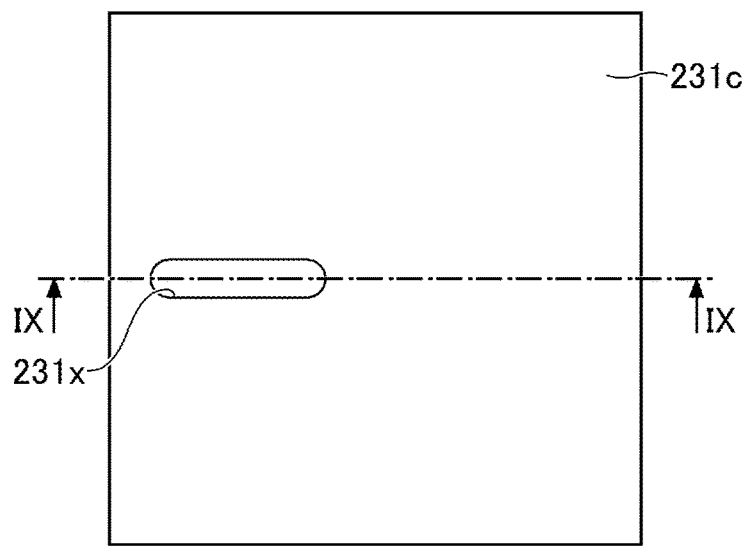
FIGS. 5A through 5C are plan views illustrating changes of the upper surface of the electronic component mounting pad according to the method of bonding the electronic component to the electronic component mounting pad according to the first embodiment.
Figure 5B:
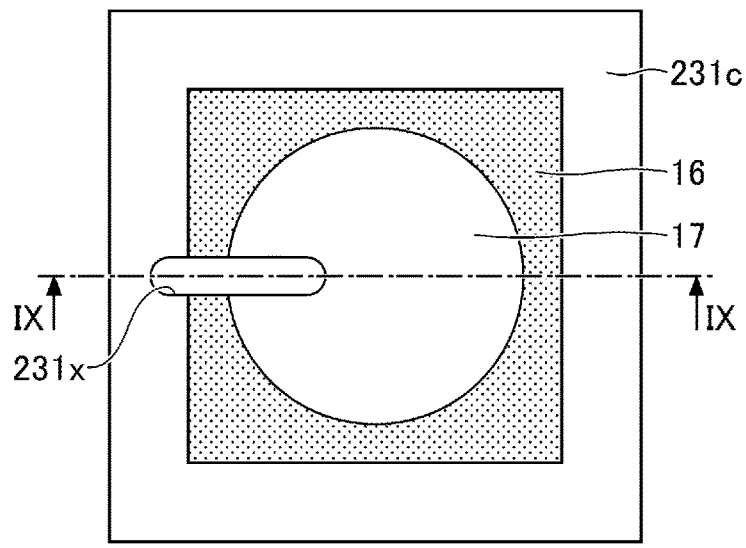
Figure 5C:
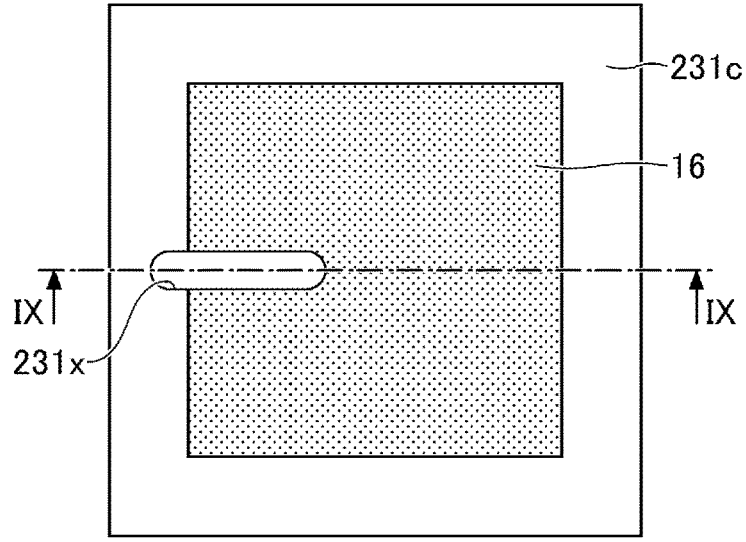

Here, a method of bonding the electronic components 10 to the electronic component mounting pads 231c is described in detail. FIGS. 4A through 4C are sectional views illustrating a method of bonding the electronic components 10 to the electronic component mounting pads 231c according to the first embodiment. FIGS. 5A through 5C are plan views illustrating changes of the upper surface of one of the electronic component mounting pads 231c according to the method of bonding the electronic components 10 to the electronic component mounting pads 231c according to the first embodiment. FIGS. 4A through 4C correspond to sectional views taken along the lines IX-IX of FIGS. 5A through 5C, respectively.

The process illustrated in FIGS. 4A and 5A corresponds to the process illustrated in FIG. 3C. In the process illustrated in FIGS. 4A and 5A, the cavities 30 that expose the upper surfaces, namely, the electronic component mounting surfaces 231d, of the electronic component mounting pads 231c are formed in the insulating layers 242A and 232. At this point, as illustrated in FIG. 4A, the cavities 30 may be famed such that the peripheries of the electronic component mounting pads 231c are covered with the insulating layers 242A and 232.

Next, in the process illustrated in FIGS. 4B and 5B, each electronic component 10 having the bonding layer 20 famed on its lower surface is attached to a bonding head of a bonder to be mounted on the electronic component mounting surface 231d of the electronic component mounting pad 231c such that the bonding layer 20 contacts the electronic component mounting pad 231c. That is, the electronic components 10 are temporarily attached. At this point, for example, in order to heat the bonding layer 20, a stage on which the laminated structure illustrated in FIG. 3C is placed is heated to approximately 50° C. to approximately 100° C. and the bonding head is heated to 50° C. to 100° C. These heating processes may cause "cry" warpage in the electronic components 10 as illustrated in FIG. 4B. That is, the electronic components 10 may curve or bulge outward (upward) (bend convexly) so that their upper surfaces on which the terminals 12 are provided are higher in the center than at the peripheral edge. In this case, in the electronic component 10 with "cry" warpage, the bonding layer 20 contacts the electronic component mounting pad 231c at the peripheral edge of the electronic component 10, but a void 15 is created between the bonding layer 20 and the electronic component mounting pad 231c inside the peripheral edge. That is, as illustrated in FIG. 5B, a contact area 16 that contacts the bonding layer 20 and a non-contact area 17 that does not contact the bonding layer 20 are formed in the electronic component mounting surface 231d of the electronic component mounting pad 231c inside the periphery of the electronic component 10 in a plan view.

According to this embodiment, the trenches 231x are formed one in each of the electronic component mounting pads 231c. Therefore, the void 15 connects to the trench 231x as illustrated in FIG. 4B, and the non-contact area 17 connects to the trench 231x as illustrated in FIG. 5B.

Next, in the process illustrated in FIGS. 4C and 5C, while heating the bonding layer 20 and performing evacuation (evacuating a chamber in which the process is executed), the upper surfaces of the electronic components 10 and the lower surface of the insulating layer 342 are pressed toward the core layer 111 with parallel flat plates. That is, the electronic components 10 are pressed against the electronic component mounting surfaces 231d to perform so-called permanent pressure bonding of the electronic components 10. According to the permanent pressure bonding, for example, diaphragms are brought into contact with the upper surfaces of the electronic components 10 and the lower surface of the insulating layer 342. Furthermore, the ambient temperature may be set to a temperature at which the bonding layer 20 can be cured, for example, approximately 80° C. to approximately 150° C. By applying pressure while performing heating and evacuation in the permanent pressure bonding, air in the voids 15 is discharged through the trenches 231x. As a result, as illustrated in FIG. 4C, the bonding layer 20 except for an area over the trench 231x contacts the electronic component mounting surface 231d of the electronic component mounting pad 231c, so that the non-contact area 17 is eliminated from the electronic component mounting surface 231d of the electronic component mounting pad 231c as illustrated in FIG. 5C. Accordingly, the warpage of the electronic component 10 is eliminated.

Through a series of such processes, the electronic components 10 are bonded to the electronic component mounting pad 231c in the process illustrated in FIG. 3D.

Figure 3E:
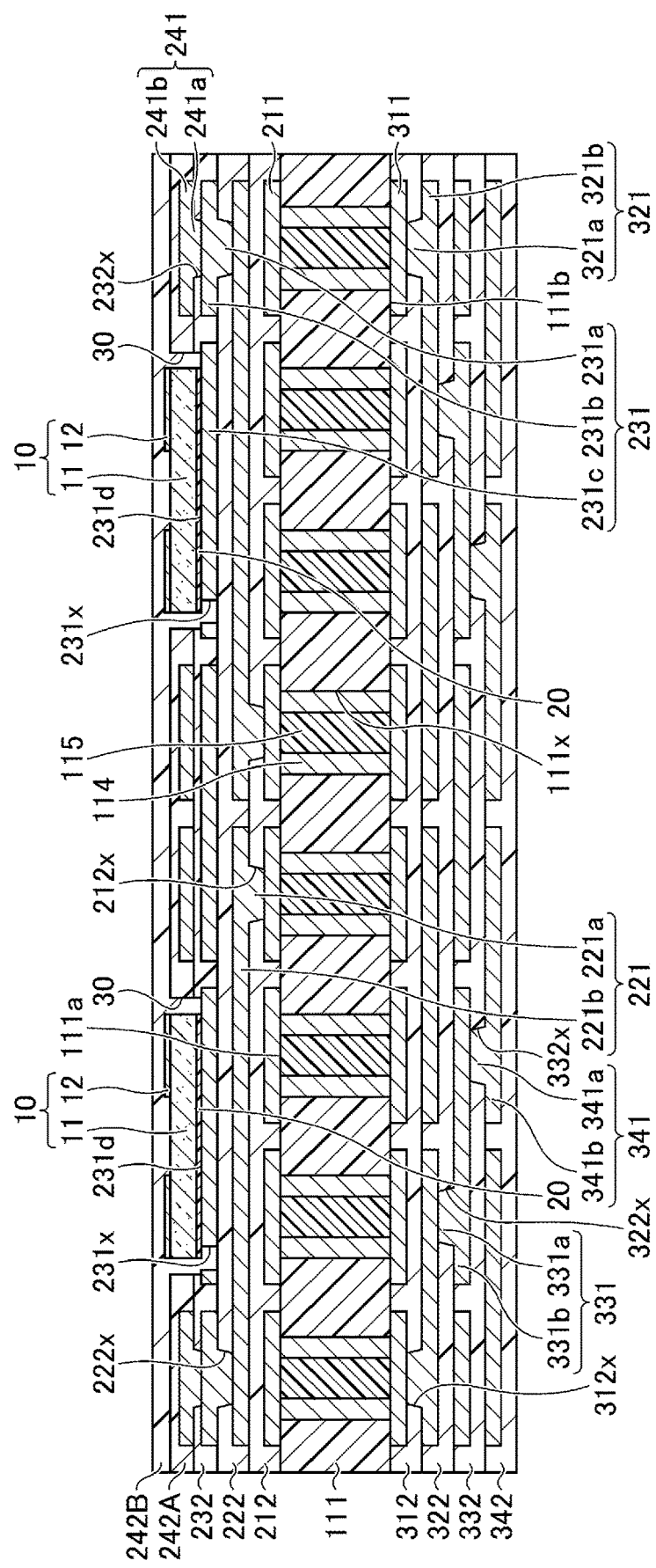

Next, in the process illustrated in FIG. 3E, the insulating layer 242B is formed to cover the electronic components 10 and the insulating layer 242A by the same process as the insulating layer 212. That is, to form the insulating layer 242B, a semi-cured epoxy resin film or the like is provided by lamination and cured. Instead of lamination of an epoxy resin film or the like, epoxy resin liquid or paste or the like may be applied and thereafter cured. The material and thickness of the insulating layer 242B may be equal to the material and thickness of the insulating layer 212, for example. Part of the insulating layer 242B enters the gaps formed between the cavities 30 and the electronic components 10. Furthermore, part of the insulating layer 242B enters the trenches 231x. The insulating layer 242B may be formed such that one or more of the trenches 231x are at least partly filled with the insulating layer 242B.

Figure 3F:
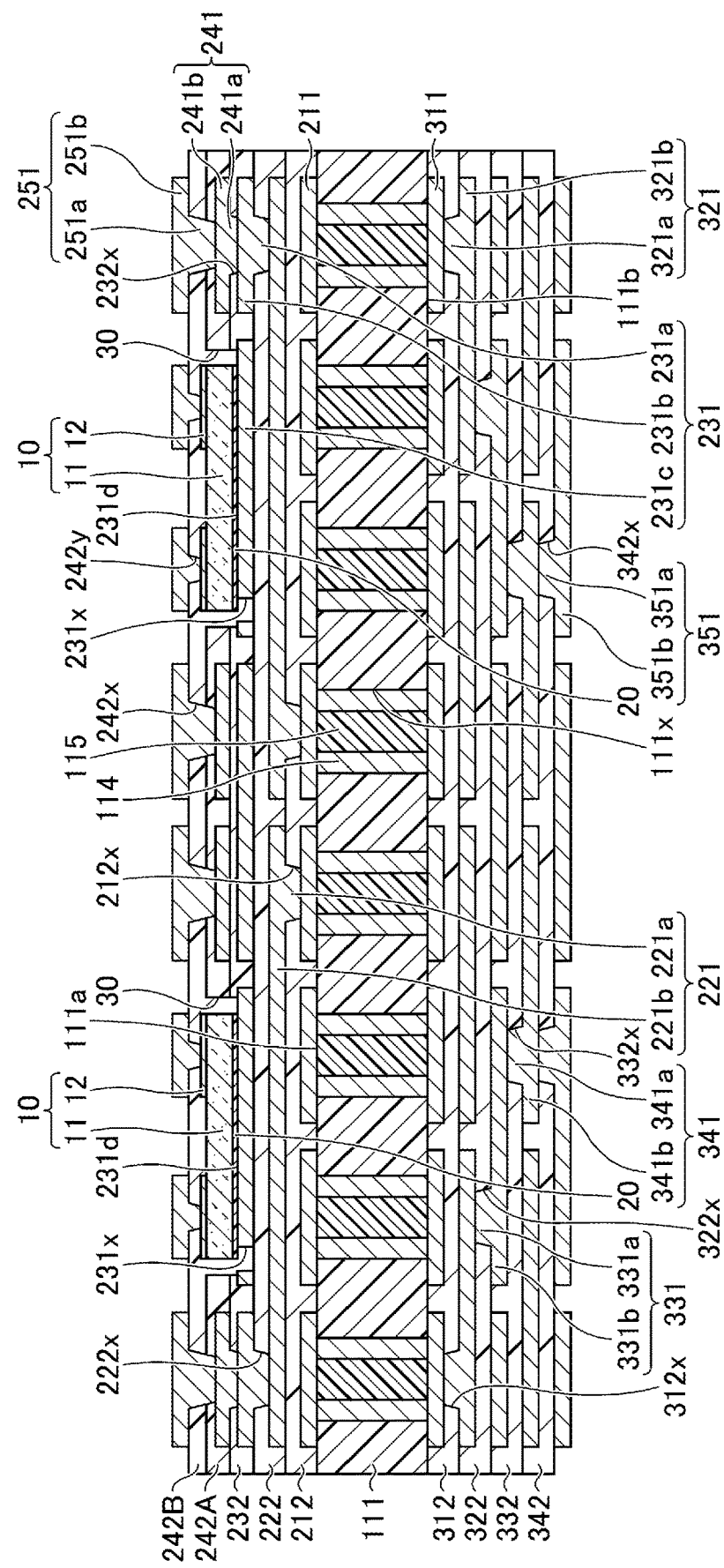

Next, in the process illustrated in FIG. 3F, the via holes 242x that pierce through the insulating layers 242B and 242A to expose the upper surface of the wiring layer 241 and the via holes 242y that pierce through the insulating layer 242B to expose the upper surfaces of the terminals 12 are formed. Furthermore, the via holes 342x that pierce through the insulating layer 342 to expose the lower surface of the wiring layer 341 are formed. The via holes 242x, 242y and 342x may be formed by, for example, laser processing using a $CO_2$ laser or the like. After the formation of the via holes 242x, 242y and 342x, a desmear process is preferably performed to remove residual resin adhering to the surface of the wiring layer 241, the surfaces of the terminals 12, and the surface of the wiring layer 341 that are exposed at the bottom of the via holes 242x, 242y and 342x, respectively.

Next, the wiring layer 251 is formed on the first side of the insulating layer 242B by the same process as the wiring layer 221. The wiring layer 251 includes the via interconnects 251a filling in the via holes 242x or 242y and the conductive pattern 251b formed on the upper surface of the insulating layer 242B. The material of the wiring layer 251 and the thickness of the conductive pattern 251b may be equal to the material and thickness, respectively, of the wiring layer 211, for example. Part of the conductive pattern 251b is electrically connected to the wiring layer 241 via the via interconnects 251a piercing through the insulating layers 242B and 242A. Another part of the conductive pattern 251b is electrically connected to the terminals 12 via the via interconnects 251a piercing through the insulating layer 242B.

Furthermore, the wiring layer 351 is formed on the second side of the insulating layer 342 by the same process as the wiring layer 221. The wiring layer 351 includes the via interconnects 351a filling in via holes 342x and the conductive pattern 351b formed on the lower surface of the insulating layer 342. The material of the wiring layer 351 and the thickness of the conductive pattern 351b may be equal to the material and thickness, respectively, of the wiring layer 211, for example. The wiring layer 351 is electrically connected to the wiring layer 341 exposed at the bottom of the via holes 342x.

Figure 3G:
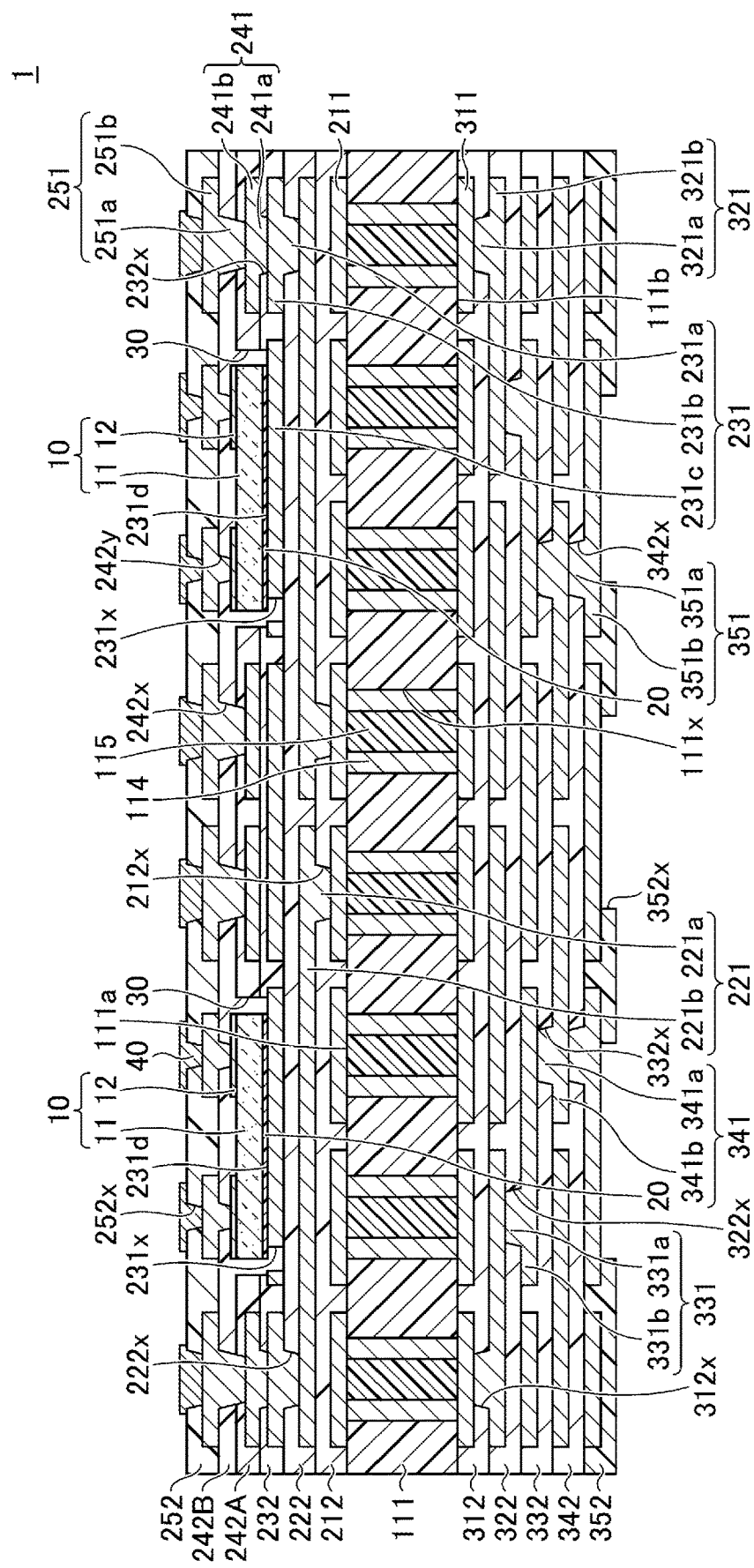

Next, in the process illustrated in FIG. 3G, the solder resist layer 252 is formed on the upper surface of the insulating layer 242B to cover the wiring layer 251. Furthermore, the solder resist layer 352 is formed on the lower surface of the insulating layer 342 to cover the wiring layer 351. The solder resist layer 252 may be formed by, for example, applying a photosensitive epoxy or acrylic resin in liquid or paste form onto the upper surface of the insulating layer 242B by a process such as screen printing, roll coating, or spin coating such that the wiring layer 251 is covered with the applied resin. Alternatively, the solder resist layer 252 may be formed by, for example, laminating the upper surface of the insulating layer 242B with a photosensitive epoxy or acrylic insulating resin film such that the wiring layer 251 is covered with the film. The solder resist layer 352 is famed by the same process as the solder resist layer 252.

Next, the solder resist layers 252 and 352 are exposed to light and developed to form the openings 252x partly exposing the upper surface of the wiring layer 251 and the openings 352x partly exposing the lower surface of the wiring layer 351 in the solder resist layers 252 and 352, respectively (photolithography). The openings 252x and 352x may alternatively be formed by laser processing or blasting. In this case, a photosensitive material does not have to be used for the solder resist layers 252 and 352. The planar shape of the openings 252x and the planar shape of the openings 352x may be, for example, circular. The diameter of the openings 252x and the diameter of the openings 352x may be designed as desired in accordance with connection targets (such as a semiconductor chip and a motherboard).

In this process, the above-described metal layer may be formed on the upper surface of the wiring layer 251 exposed at the bottom of the openings 252x and the lower surface of the wiring layer 351 exposed at the bottom of the openings 352x by, for example, electroless plating. Instead of forming the metal layer, it is possible to perform anti-oxidation treatment such as an OSP process.

Next, the external connection terminals 40 such as solder bumps are formed on the upper surface of the wiring layer 251 exposed at the bottom of the openings 252x. The external connection terminals 40 serve as terminals for electrically connecting to a semiconductor chip.

In this manner, the component-containing substrate 1 can be manufactured.

As noted above, "cry" warpage may be caused in the electronic component 10 when the electronic component 10 is temporarily attached (see FIG. 4B). It is assumed that the trench 231x is not formed in the electronic component mounting pad 231c and the electronic component mounting pad 231c is solid. In this case, if the electronic component 10 with "cry" warpage is subjected to permanent pressure bonding, the void 15 remains between the electronic component 10 and the electronic component mounting pad 231c, so that the electronic component 10 is bonded with "cry" warpage. Therefore, a bulge reflecting the "cry" warpage of the electronic component 10 is caused in the upper surfaces of the insulating layer 242B and the solder resist layer 252 to make it difficult to mount a semiconductor chip on the component-containing substrate 1.

In contrast, according to this embodiment, the trench 231x is famed in the electronic component mounting pad 231c. Therefore, the void 15 connects to the trench 231x, so that air in the void 15 is discharged through the trench 231x during permanent pressure bonding. As a result, the non-contact area 17 is eliminated from the upper surface of the electronic component mounting pad 231c, and the warpage of the electronic component 10 is eliminated. Accordingly, it is possible to prevent a bulge reflecting the "cry" warpage of the electronic component 10 in the upper surfaces of the insulating layer 242B and the solder resist layer 252. That is, the semiconductor chip mounting surface can stably have good flatness.

The void 15 is likely to be caused when the electronic component 10 has a size greater than 6 mm×6 mm in a plan view. Therefore, this embodiment is particularly effective when the electronic component 10 has such a size.

The trench 231x is preferably separated (spaced apart) from the terminal 12 provided on the electronic component 10 in a plan view. If the trench 231x overlaps the terminal 12 in a plan view, the electronic component 10 may deform during formation of the via holes 242y in the insulating layer 242B. It is possible to control such deformation when the trench 231x is separated from the terminal 12.

[b] Second Embodiment

Next, a second embodiment is described. The second embodiment is mainly different from the first embodiment in the depth of a trench formed in the electronic component mounting pad 231c.

Figure 6:
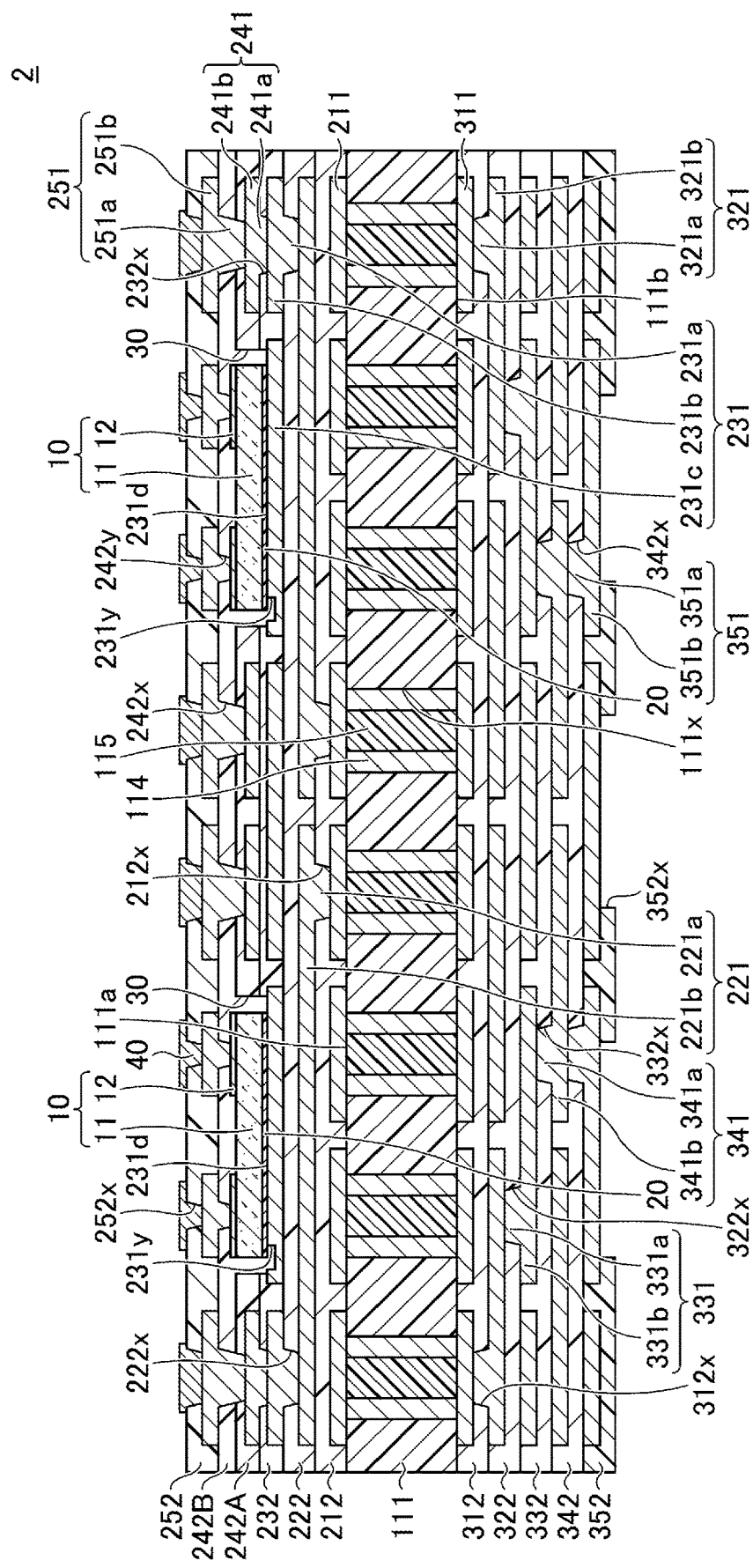
FIG. 6 is a sectional view of a component-containing substrate according to a second embodiment.

First, the structure of a component-containing substrate is described. FIG. 6 is a sectional view of a component-containing substrate 2 according to the second embodiment.

Referring to FIG. 6, according to the component-containing substrate 2 of the second embodiment, in place of the trenches 231x, trenches 231y are formed one in each of the electronic component mounting pads 231c. The trenches 231y have a depth approximately half as much as the thickness of the electronic component mounting pads 231c, and do not pierce through the electronic component mounting pads 231c. Accordingly, unlike in the first embodiment, the upper surface of the insulating layer 222 is not exposed in the trenches 231y.

Otherwise, the second embodiment may be the same as the first embodiment.

Figure 7A:
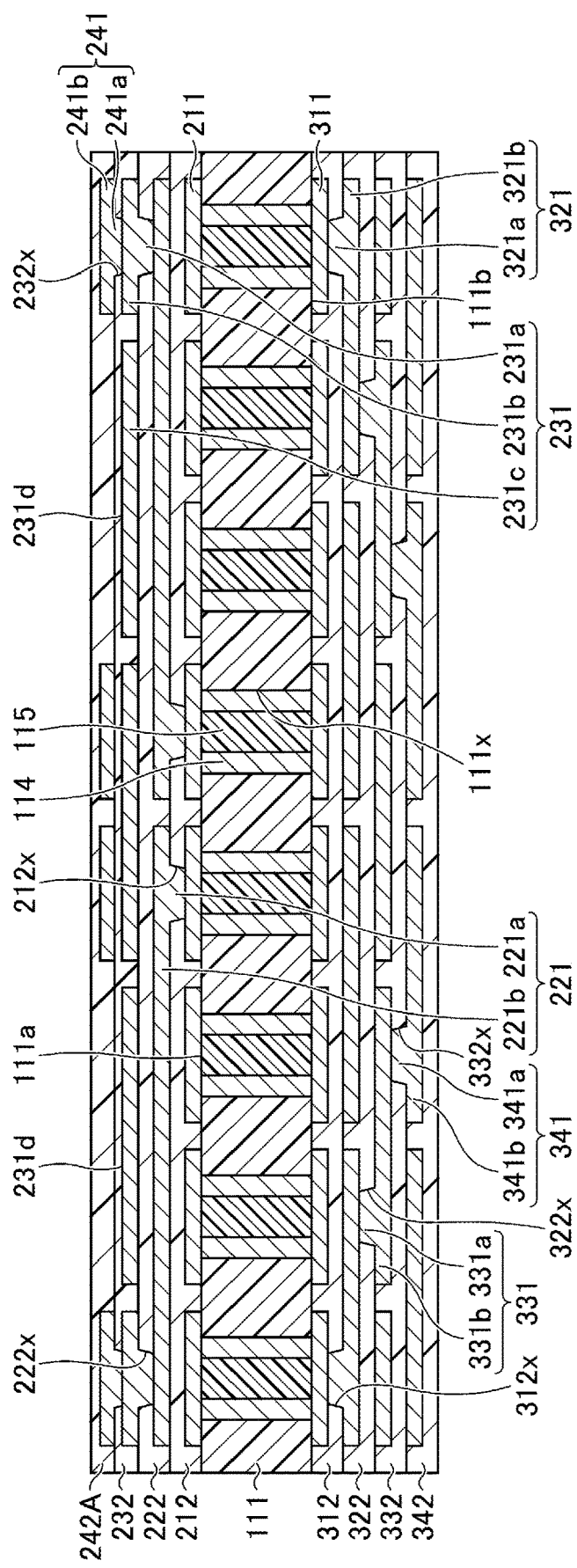
FIGS. 7A through 7C are diagrams illustrating a method of manufacturing a component-containing substrate according to the second embodiment.
Figure 7B:
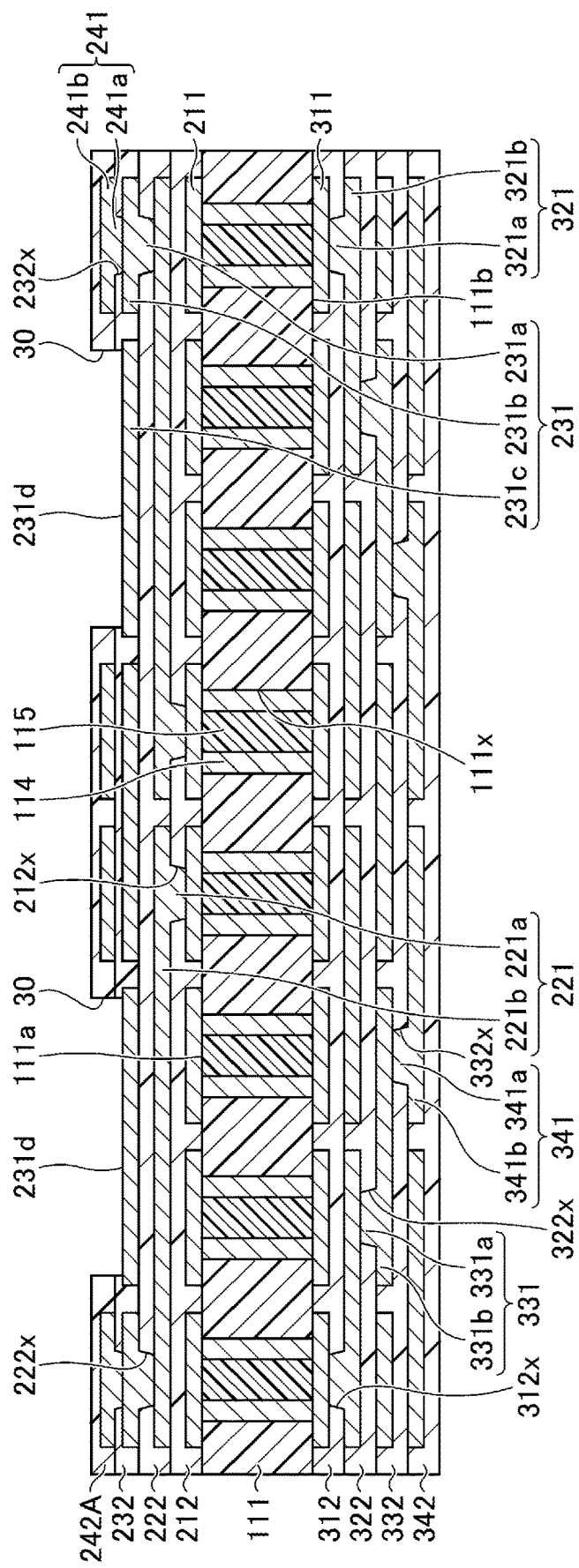
Figure 7C:
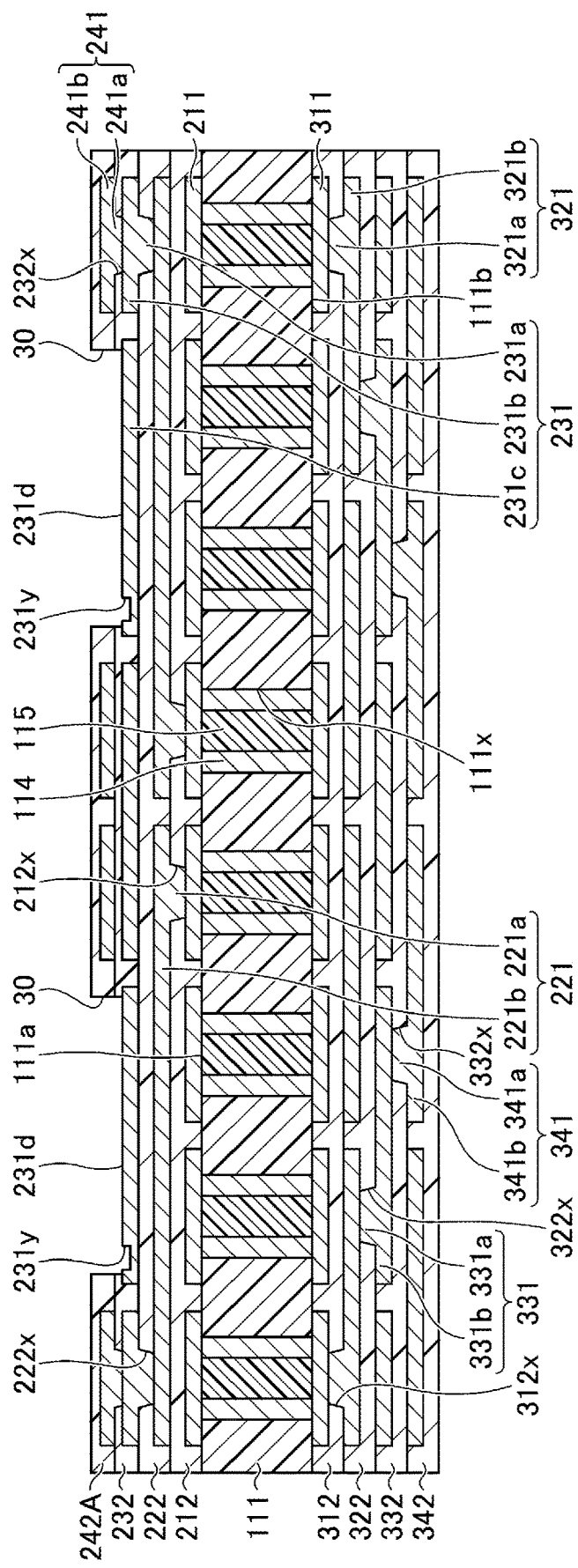

Next, a method of manufacturing a component-containing substrate according to the second embodiment is described. FIGS. 7A through 7C are diagrams illustrating a method of manufacturing a component-containing substrate according to the second embodiment.

First, in the process illustrated in FIG. 7A, the process up to the formation of the insulating layers 242A and 342 is executed the same as in the first embodiment. The trenches 231x, however, are not formed in the electronic component mounting pads 231c, and the electronic component mounting pads 231c are formed in solid form.

Next, in the process illustrated in FIG. 7B, the cavities 30 that expose the upper surfaces of the electronic component mounting pads 231c are formed in the insulating layers 242A and 232 the same as in the first embodiment. The cavities 30 may be formed by, for example, laser processing using a $CO_2$ laser or the like. According to the first embodiment, the trenches 231x piercing through the electronic component mounting pads 231c are famed before the formation of the cavities 30. Therefore, during the formation of the cavities 30, a trench that connects to the trench 231x may be formed in the insulating layer 222 under one or more of the electronic component mounting pads 231c. In contrast, according to the second embodiment, the electronic component mounting pads 231c are formed in solid form. Therefore, no trenches are famed in the insulating layer 222 during the formation of the cavities 30.

Next, in the process illustrated in FIG. 7C, the trenches 231y are formed one in each of the electronic component mounting pads 231c. To form the trenches 231y, for example, a resist pattern having openings matching the shapes of the trenches 231y is formed on the upper surfaces of the insulating layer 242B and the electronic component mounting pads 231c, and the electronic component mounting pads 231c are subjected to half etching.

Thereafter, the electronic components 10 are bonded to the electronic component mounting pads 231c and the subsequent process is performed the same as in the first embodiment.

In this manner, the component-containing substrate 2 can be manufactured.

According to the second embodiment as well, the same effects as in the first embodiment can be achieved. Furthermore, according to the second embodiment, it is possible to prevent trenches from being formed in the insulating layer 222 during the formation of the cavities 30.

The planar shape of the trenches 231x and 231y is not limited in particular. For example, their shape may be elliptic, rectangular, rectangular with rounded corners, sectoral (fan-shaped), etc. Furthermore, the positions at which the trenches 231x and 231y are provided and their respective numbers are not limited in particular, either. For example, the trench 231x or 231y may be formed to cross the perimeter of the electronic component 10 at two points. Furthermore, two or more of the trenches 231x or 231y may be famed in each of the electronic component mounting pads 231c.

Figure 8A:
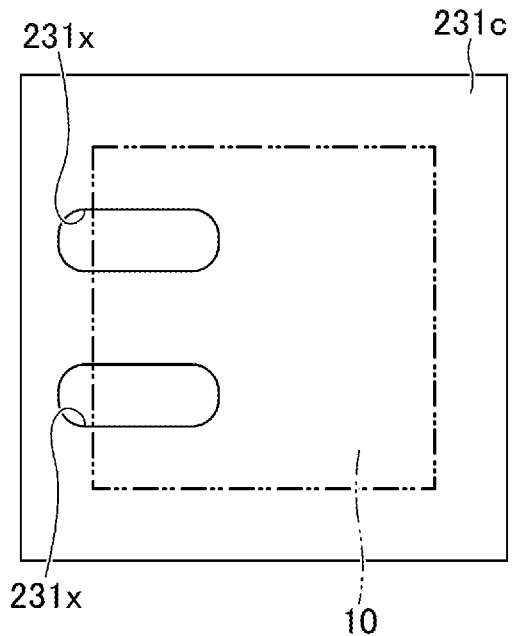
FIGS. 8A through 8D are plan views illustrating the planar shapes or arrangements of other examples of trenches.
Figure 8B:
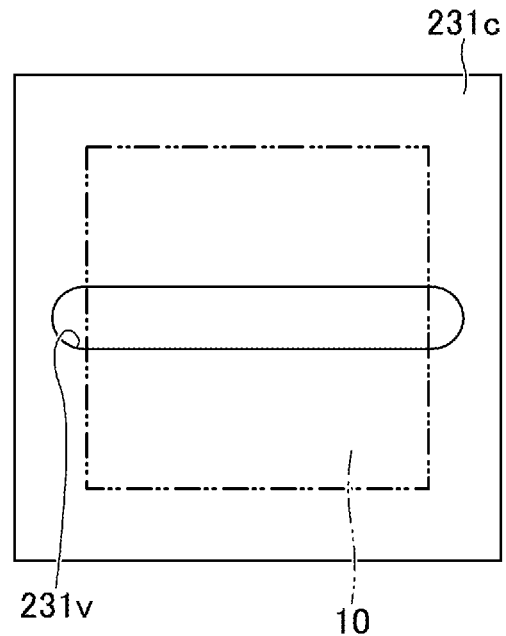
Figure 8C:
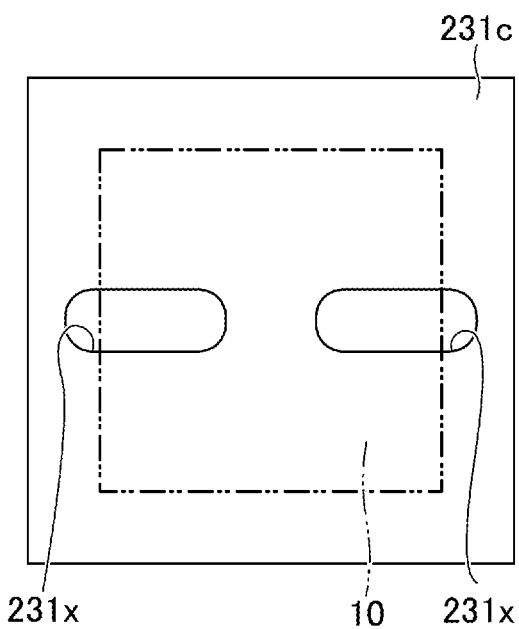
Figure 8D:
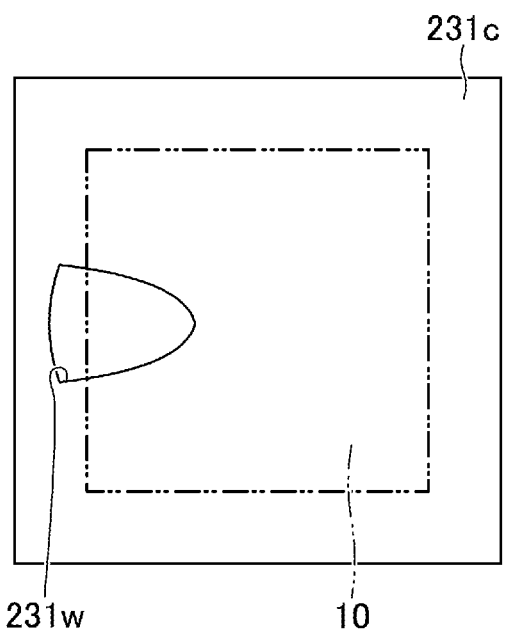

FIGS. 8A through 8D illustrate the planar shapes or arrangements of other examples of trenches. FIG. 8A illustrates an example where multiple (two in the illustrated case) trenches 231x are provided with respect to any one side of the electronic component 10. FIG. 8B illustrates an example where a trench 231v longer than the trench 231x is provided across the electronic component 10. In a plan view, the trench 231v crosses two parallel sides of the electronic component 10. FIG. 8C illustrates an example where two trenches 231x are provided one across each of any two sides, two parallel sides in the illustrated case, of the electronic component 10. The number of trenches 231x provided across each side may be two or more as in the example illustrated in FIG. 8A. FIG. 8D illustrates an example where a trench 231w having a sectoral planar shape is provided. The trench 231w is provided such that a part corresponding to the center of the sector is positioned inside the outer edge (within the perimeter) of the electronic component 10 and a part corresponding to the arc of the sector is positioned outside the outer edge of the electronic component 10. Because the part corresponding to the arc is positioned outside the outer edge of the electronic component 10, the material of the insulating layer 242B easily enters the trench 231w through the part corresponding to the arc. While the trenches 231v and 231w are variations of the trenches 231x, variations of the trenches 231y may also have the same planar shapes as the trenches 231v and 231w.

The adhesion of the electronic component 10 to the electronic component mounting pad 231c, however, decreases as the proportion of the area occupied by the trench 231x or 231y to the area of a region of the electronic component mounting surface 231d of the electronic component mounting pad 231c on which region the electronic component 10 is mounted increases in a plan view. Accordingly, the planar shapes, positions, number, etc., of the trenches 231x and 231y are preferably selected in view of the adhesion of the electronic component 10 to the electronic component mounting pad 231c.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clauses:

1. A method of manufacturing a component-containing substrate, including:
    forming a trench in a surface of a pad formed in a substrate base;
    forming a cavity in the substrate base such that the cavity exposes the surface of the pad;
    mounting an electronic component on the surface of the pad such that the trench continues from an inside to an outside of a perimeter of the electronic component in a plan view; and
    bonding the mounted electronic component to the surface of the pad.

2. The method of clause 1, wherein bonding the electronic component includes pressing the electronic component against the surface of the pad while performing evacuation after mounting the electronic component to the surface of the pad.

What is claimed is:

1. A component-containing substrate comprising:
    a substrate base including one or more wiring layers and one or more insulating layers, the substrate base including a cavity;
    a pad at a bottom of the cavity; and
    an electronic component bonded to a surface of the pad exposed in the cavity,
    wherein a trench is formed in the surface of the pad, the trench continuing from an inside to an outside of a perimeter of the electronic component in a plan view.

2. The component-containing substrate as claimed in claim 1, wherein
    the one or more insulating layers include an insulating layer covering the electronic component and filling in the cavity.

3. The component-containing substrate as claimed in claim 2, further comprising:
    an external connection terminal on an opposite side of the insulating layer from the pad, the external connection terminal being electrically connected to a terminal of the electronic component, the terminal being on a surface of the electronic component facing away from the pad.

4. The component-containing substrate as claimed in claim 3, wherein
    the one or more wiring layers include a wiring layer formed on and through the insulating layer and electrically connected to the terminal of the electronic component,
    the one or more insulating layers further include a solder resist layer formed on the insulating layer and covering the wiring layer, and
    the external connection terminal is on a surface of the wiring layer exposed at a bottom of an opening formed in the solder resist layer.

5. The component-containing substrate as claimed in claim 3, wherein the trench is separated from the terminal of the electronic component in the plan view.

6. The component-containing substrate as claimed in claim 2, wherein the insulating layer fills in at least a part of the trench.

7. The component-containing substrate as claimed in claim 1, wherein the trench pierces through the pad.

8. The component-containing substrate as claimed in claim 1, wherein a depth of the trench is smaller than a thickness of the pad.

9. The component-containing substrate as claimed in claim 1, wherein the trench crosses the perimeter of the electronic component at one or more points in the plan view.

10. The component-containing substrate as claimed in claim 1, wherein an additional trench is further formed in the surface of the pad, the additional trench continuing from the inside to the outside of the perimeter of the electronic component in the plan view.

11. The component-containing substrate as claimed in claim 1, wherein the trench has a planar shape that is elliptic, rectangular, rectangular with rounded corners, or sectoral.

12. The component-containing substrate as claimed in claim 1, wherein the pad is formed of a metallic material.

* * * * *